(12) United States Patent
Prejbeanu et al.

(10) Patent No.: US 8,609,439 B2
(45) Date of Patent: Dec. 17, 2013

(54) MAGNETIC TUNNEL JUNCTION COMPRISING A POLARIZING LAYER

(75) Inventors: Ioan Lucian Prejbeanu, Seyssinet Pariset (FR); Ricardo Sousa, Grenoble (FR)

(73) Assignee: Crocus Technology SA, Grenoble Cedex (FR)

( * ) Notice: Subject to any disclaimer, the term of this patent is extended or adjusted under 35 U.S.C. 154(b) by 1 day.

(21) Appl. No.: 13/348,996

(22) Filed: Jan. 12, 2012

(65) Prior Publication Data
US 2012/0181642 A1    Jul. 19, 2012

(30) Foreign Application Priority Data

Jan. 13, 2011    (EP) ..................................... 11290013

(51) Int. Cl.
*H01L 21/00* (2006.01)
*H01L 29/82* (2006.01)

(52) U.S. Cl.
USPC ................ 438/3; 438/238; 438/382; 257/421

(58) Field of Classification Search
USPC .............. 438/3, 381, 382, 238; 257/421, 427; 365/158, 171, 173
See application file for complete search history.

(56) References Cited

U.S. PATENT DOCUMENTS

| | | | |
|---|---|---|---|
| 5,640,343 | A | 6/1997 | Gallagher et al. |
| 5,695,864 | A | 12/1997 | Slonczewski |
| 6,603,677 | B2 | 8/2003 | Redon et al. |
| 2006/0003185 | A1 | 1/2006 | Parkin |
| 2006/0092696 | A1 | 5/2006 | Bessho |
| 2006/0132990 | A1 | 6/2006 | Morise et al. |
| 2008/0151614 | A1 | 6/2008 | Guo |

OTHER PUBLICATIONS

Miyanishi S et al.: "High-Density Laser-Assisted Magnetic Recording on TbFeCo Media With an Al Underlayer", Journal of Applied Physics, American Institute of Physics, New York, US, vol. 93, No. 10, May 15, 2003, pp. 7801-7803.
European Search Report for EP 11 29 0013 dated Jul. 14, 2011.

*Primary Examiner* — Kevin M Picardat
(74) *Attorney, Agent, or Firm* — Pearne & Gordon LLP

(57) ABSTRACT

The present disclosure concerns memory device comprising magnetic tunnel junction comprising a tunnel barrier layer between a first ferromagnetic layer having a first magnetization with a fixed orientation and a second ferromagnetic layer having a second magnetization being freely orientable, and a polarizing layer having a polarizing magnetization substantially perpendicular to the first and second magnetization; the first and second ferromagnetic layers being annealed such that a tunnel magnetoresistance of the magnetic tunnel junction is equal or greater than about 150%. Also disclosed is a method of forming the MRAM cell.

8 Claims, 1 Drawing Sheet

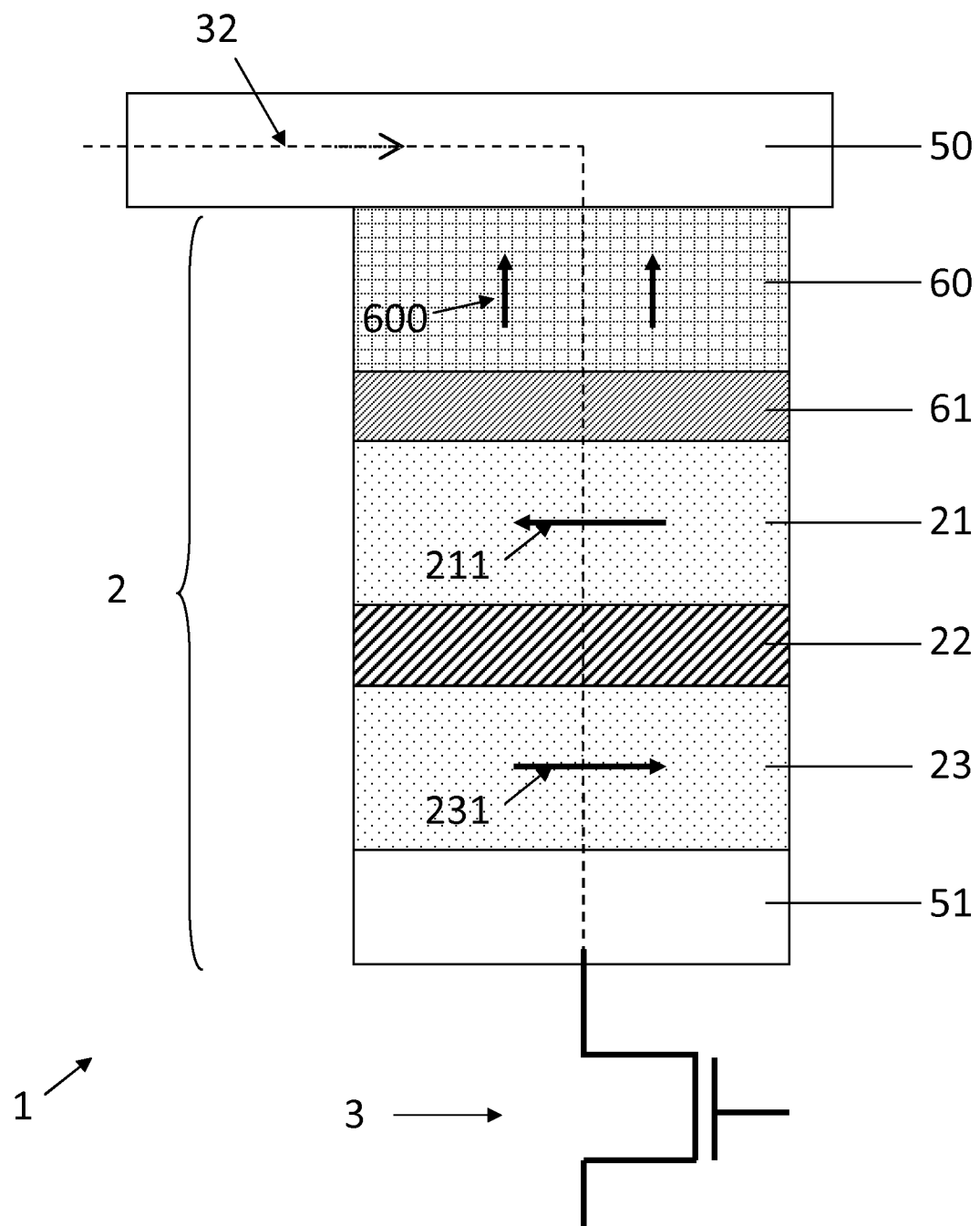

MAGNETIC TUNNEL JUNCTION COMPRISING A POLARIZING LAYER

FIELD

The present disclosure concerns a method for manufacturing a magnetic tunnel junction comprising a polarizing layer and to be written with a spin polarized current having a low magnitude.

BACKGROUND

Magnetic random access memories (MRAM) have been the object of a renewed interest with the discovery of magnetic tunnel junctions having a strong magnetoresistance at ambient temperature. These MRAMs present many advantages such as speed (a few nanoseconds of duration of writing and reading), non volatility, and insensitivity to ionizing radiations. Consequently, they are increasingly replacing memory that uses more conventional technology based on the charge state of a capacitor (DRAM, SRAM, FLASH).

A conventional MRAM cell, such as the one described in U.S. Pat. No. 5,640,343, is formed from a magnetic tunnel junction comprising a first ferromagnetic layer having a fixed magnetization, a second ferromagnetic layer having a magnetization direction that can be varied during a write operation of the MRAM cell, and thin insulating layer, or tunnel barrier, between the two ferromagnetic layers. During the write operation of the MRAM cell, the magnetization of the second ferromagnetic layer can be oriented parallel or anti-parallel with the one of the first ferromagnetic layer, resulting in a low or high magnetic junction resistance, respectively.

The MRAM cell can be written using a write operation based on a spin transfer torque (STT) scheme, such as described in U.S. Pat. No. 5,695,864. The STT-based write operation comprises passing a spin polarized current through the magnetic tunnel junction via a current line connected to the magnetic tunnel junction. In contrast with MRAM cells written with an external magnetic field, the spin polarized current scales inversely proportional with the surface area of the magnetic tunnel junction. MRAM cells written with the STT-based write operation, or STT-based MRAM cells, thus hold promise for high density MRAM. Moreover, STT-based MRAM cells can be written faster than when MRAM cells are written using an external magnetic field.

Most practical implementations of the STT-based MRAM cells so far involve a so-called "longitudinal" configuration wherein the spins of the spin polarized current are injected collinearly with the magnetization of the second ferromagnetic layer. This is typically achieved by using ferromagnetic materials having in-plane magnetization (magnetization in the plane of the ferromagnetic layer), or a magnetization perpendicular to plane.

In conventional STT-based MRAM cells, the injected spins of the spin polarized current are aligned substantially parallel to the orientation of the magnetization of the second ferromagnetic layer. The torque exerted by the injected spins on the magnetization of the second ferromagnetic layer is then substantially zero.

During the STT-based write operation, the writing speed is limited by the stochastic nature of switching the magnetization of the second ferromagnetic layer. This stochastic behavior is determined by the parallel orientation of the injected spins determined by the magnetization direction of the first ferromagnetic layer, or of a polarizing layer, with respect to the direction of the magnetization of the second ferromagnetic layer. Switching of the second ferromagnetic layer magnetization is triggered by thermal activation of the magnetization; i.e., when thermal fluctuation of the second ferromagnetic layer magnetization produces an initial angle between the injected spins and this magnetization of the second ferromagnetic layer. The switching speed is typically limited by a switching delay of about 10 ns for spin polarized currents in the range of 10 $MA/cm^2$ or less than 10 ns for currents in the range of 100 $MA/cm^2$.

In order to be able to write the memory cell at currents below 1 $MA/cm^2$ for current pulse widths smaller than 10 ns can be obtained by inserting a perpendicularly magnetized layer, or a perpendicular polarizer, to the magnetic tunnel junction. The perpendicular polarizer generates, even at very short pulse widths, an initial angle between the orientation of the first and second ferromagnetic layer magnetization. This initial angle maximizes the initial torque and thus minimizes the critical spin polarized current needed for the switching the magnetization of the second ferromagnetic layer.

In U.S. Pat. No. 6,603,677, the magnitude of the spin polarized current is decreased by adding a spin polarizing layer or a synthetic antiferromagnetic (SAF) multilayer to the magnetic tunnel junction. Alternatively, the saturation magnetization of the second ferromagnetic layer can be decreased, or the spin polarization level of the injected electrons in the spin polarized current can be increased, for example, by providing the tunnel barrier made from MgO.

In order to obtain a suitable crystallographic texture of the first and second ferromagnetic layers adjacent to the MgO tunnel barrier, the latter layer needs to be annealed at annealing temperatures larger than 300° C., typically comprised between 340° C. and 360° C. Typical perpendicular polarizer is made of multilayers based on cobalt/platinum or cobalt/palladium or cobalt/nickel or on rare-earths/transition metals alloys. In the case the magnetic tunnel junction comprising the MgO-based tunnel barrier and the perpendicular polarizer is submitted to the annealing temperatures above, intermixing at the interfaces of the multilayered perpendicular polarizer can occur. Moreover, the rare-earth/transition alloys can be instable at these annealing temperatures.

Conventional magnetic tunnel junction manufacturing processes comprise depositing the different layers forming the magnetic tunnel junction, including the perpendicular polarizer and the MgO-based tunnel barrier, and performing the annealing of the complete magnetic tunnel junction. Consequently, proper annealing of the MgO-based tunnel barrier and good properties of the perpendicular polarizer in the same magnetic tunnel junction. It is thus not possible to obtain simultaneously a large magnetoresistance and a well defined perpendicular polarizer in the same magnetic tunnel junction.

SUMMARY

The present disclosure is therefore aimed at overcoming these disadvantages.

The present disclosure concerns a method of forming a magnetic tunnel junction to be written with a spin polarized current, the magnetic tunnel junction comprising a tunnel barrier layer between a first ferromagnetic layer having a first magnetization and a second ferromagnetic layer having a second magnetization, and a polarizing layer having a polarizing magnetization; comprising: depositing the first ferromagnetic layer, the tunnel barrier layer, and the second ferromagnetic layer; annealing the deposited ferromagnetic layers at a first predetermined annealing temperature such as a tunnel magnetoresistance of the magnetic tunnel junction is equal or greater than about 150%; wherein the method can further comprise depositing the polarizer layer; and annealing the deposited polarizer layer at a second predetermined annealing temperature, said annealing the deposited ferromagnetic layers at the first predetermined annealing temperature being performed prior to depositing the polarizer layer, and the second predetermined annealing temperature being such that as to orient the polarizing magnetization substantially perpendicular to the first and second magnetization.

In an embodiment, the second predetermined annealing temperature can be lower that the first predetermined annealing temperature.

In another embodiment, the first predetermined annealing temperature can be comprised between about 340° C. and 360° C.

In yet another embodiment, the second predetermined annealing temperature is comprised between about 150° C. and 250° C.

In yet another embodiment, depositing the second ferromagnetic layer, the tunnel barrier layer, and the first ferromagnetic layer, can be performed in this order.

In yet another embodiment, depositing the first ferromagnetic layer, the tunnel barrier layer, and the second ferromagnetic layer is performed in this order.

The disclosure further concerns a MRAM cell comprising the magnetic tunnel junction manufactured by the method disclosed herein.

The method disclosed herein allows for manufacturing the magnetic tunnel junction having a high tunnel magnetoresistance and comprising the polarizer layer having a perpendicular polarizing magnetization. The magnetic tunnel junction manufactured with the method disclosed herein can be written using the spin polarized current having a low magnitude.

BRIEF DESCRIPTION OF THE DRAWINGS

The invention will be better understood with the aid of the description of an embodiment given by way of example and illustrated by FIG. 1 representing a magnetic random access memory (MRAM) cell comprising a magnetic tunnel junction according to an embodiment.

DETAILED DESCRIPTION OF POSSIBLE EMBODIMENTS

FIG. 1 represents a magnetic random access memory (MRAM) cell 1 comprising a magnetic tunnel junction 2 according to an embodiment. The magnetic tunnel junction 2 comprises a first ferromagnetic layer 21, a second ferromagnetic layer 23 and an insulating layer, or tunnel barrier layer 22 between the first and second ferromagnetic layers 21, 23. Preferably, the first ferromagnetic layer 21 has a first magnetization 211 having a fixed orientation and the second ferromagnetic layer 23 has a second magnetization 231 that can be freely oriented. The first magnetization 211 can be exchange coupled with an anti-ferromagnetic layer (not shown).

Preferentially, the first ferromagnetic layer 21 and the second ferromagnetic layer 23 are made of 3d metals such as Fe, Co or Ni or their alloys. Eventually, boron can be added in the layer composition in order obtain an amorphous morphology and a flat interface. The tunnel barrier layer 22 typically consists of alumina ($Al_2O_3$) or magnesium oxide (MgO). Preferentially, the first ferromagnetic layer 21 can be formed from a synthetic antiferromagnetic layer such as described, for instance, in U.S. Pat. No. 5,583,725.

The second magnetization 231 can be oriented only in the plane of the layer 23.

The magnetic tunnel junction 2 further comprises a polarizing layer 60 and a metallic separating layer 61 comprised between the polarizing layer 60 and the first ferromagnetic layer 21. In the present embodiment, the polarizing layer 60 has a perpendicular polarizing magnetization 600, i.e., the polarizing magnetization 600 of the polarizing layer 60 is oriented substantially perpendicular to the plane of the layer 60, or substantially perpendicular to the first and second magnetizations 211, 231.

The polarizing layer 60 can comprise a stack of layers, made for example of Fe/Pt or Fe/Pd or Co/Pt, or Co/Pd, or Co/Au, etc. or of their alloys, or made of rare-earths/transition metals alloys.

The magnetic tunnel junction 2 can further comprise a first electrically conductive line, or first electrode 50, and a second electrically conductive line, or second electrode 51, disposed at one end of the magnetic tunnel junction 2, on the side of the polarizing layer 60, and at the other end of the magnetic tunnel junction 2, respectively. The MRAM cell 1 can further comprise a switching device, such as a CMOS selecting transistor 3, in electrical communication with one end of the magnetic tunnel junction 2.

During a write operation, a spin polarized current 32 is passed through the magnetic tunnel junction 2 with a predetermined magnitude such that the second magnetization 231 can be switched. When the polarizing magnetization 600 of the polarizing layer 60 is oriented substantially perpendicular the first and second magnetizations 211, 231, the electrons of the spin polarized current 32 are polarized in the polarizing layer 60 with a spin direction perpendicular to the planes of the layers 21, 23. The polarized spin electrons of the spin polarized current 32 cause a continuous rotation of the second magnetization 231 within the plane of the second ferromagnetic layer 23. In the magnetic tunnel junction 2 disclosed herein, the orientation of the second magnetization 231 can be switched when the predetermined magnitude of the spin polarized current 32 is about $1 \times 10^6$ $A/cm^2$ and below.

According to an embodiment, a method of forming the magnetic tunnel junction 2 comprises depositing the second electrode 51, the second ferromagnetic layer 23, the tunnel barrier layer 22, and the first ferromagnetic layer 21.

The method further comprises annealing the deposited ferromagnetic layers 21, 23, i.e., for example, annealing the magnetic tunnel junction 2 comprising the deposited layers 51, 21, 22 and 23, at a first predetermined annealing temperature, adapted to obtain a suitable crystallographic texture of the first and second ferromagnetic layers 21, 23. The first predetermined annealing temperature is such that after the annealing step at the first predetermined annealing temperature, the tunnel magnetoresistance of the magnetic tunnel junction 2 is maximal, for example, has a tunnel magnetoresistance value of about 150% and greater. For example, the first predetermined annealing temperature can be larger than 300° C. In an embodiment, the first predetermined annealing temperature is comprised between about 340° C. and 360° C.

The method further comprises depositing the metallic separating layer 61 and the polarizer layer 60.

After the polarizer layer 60 has been deposited, the method further comprises annealing the deposited polarizer layer 60, i.e., annealing the magnetic tunnel junction 2 comprising the deposited polarizer layer 60, at a second predetermined annealing temperature. The second predetermined annealing temperature can be such as to orient the polarizing magnetization 600 of the polarizer layer 60 substantially perpendicular to the plane of the polarizer layer 60, or substantially perpendicular to the first and second magnetizations 211, 231. The second predetermined annealing temperature is typically lower that the first predetermined annealing temperature. For example, the second predetermined annealing temperature is comprised between about 150° C. and 250° C.

In an embodiment, depositing the first ferromagnetic layer 21, the tunnel barrier layer 22, and the second ferromagnetic layer 23 is performed in this order. The magnetic tunnel junction 2 thus manufactured comprises the second ferromagnetic layer 23 between the polarizer layer 60 and the first ferromagnetic layer 21.

In another embodiment, depositing the second ferromagnetic layer 23, the tunnel barrier layer 22, and the first ferromagnetic layer 21, is performed in this order. The magnetic tunnel junction 2 thus manufactured comprises the first ferromagnetic layer 21 between the polarizer layer 60 and the second ferromagnetic layer 23.

Other sequences of depositing and annealing steps of the method are possible providing that the step of annealing the deposited ferromagnetic layers 21, 23 at the first annealing temperature is performed prior to depositing the polarizer layer 60.

A magnetic memory device (not represented) can be formed from an array comprising a plurality of the MRAM cell 1 comprising the magnetic tunnel junction 2 disclosed herein.

The magnetic tunnel junction 2 manufactured using the method disclosed herein allows for obtaining the magnetic tunnel junction 2 comprising the polarizer layer 60 having its polarizing magnetization 600 substantially perpendicular to the plane of the polarizer layer 60, or substantially perpendicular to the first and second magnetizations 211, 231, and having a high tunnel magnetoresistance. The method further allows for minimizing intermixing at the interfaces of the multilayered polarizer layer 60 while the ferromagnetic layers 21, 23 and the tunnel barrier layer 22 are annealed at the high first predetermined annealing temperature, allowing for the high tunnel magnetoresistance to be equal or greater than 150%.

REFERENCE NUMBERS AND SYMBOLS

1 MRAM cell
2 magnetic tunnel junction
21 first ferromagnetic layer
211 first magnetization
22 tunnel barrier layer
23 second ferromagnetic layer
231 second magnetization
3 selecting transistor
30 front-end layer
32 spin polarized current
50 first electrically conductive line, first electrode
51 second electrically conductive line, second electrode
60 polarizing layer
600 polarizing magnetization
61 metallic separating layer

The invention claimed is:

1. A method for manufacturing a magnetic tunnel junction to be written with a spin polarized current, the magnetic tunnel junction comprising a tunnel barrier layer between a first ferromagnetic layer having a first magnetization with a fixed orientation and a second ferromagnetic layer having a second magnetization being freely orientable, and a polarizing layer having a polarizing magnetization; comprising:
    depositing the first ferromagnetic layer, the tunnel barrier layer, and the second ferromagnetic layer;
    annealing the deposited ferromagnetic layers at a first annealing temperature such as a tunnel magnetoresistance of the magnetic tunnel junction is equal or greater than about 150%;
    depositing the polarizer layer; and
    annealing the deposited polarizer layer at a second annealing temperature such as to orient the polarizing magnetization substantially perpendicular to the first and second magnetization, said annealing the deposited ferromagnetic layers at the first annealing temperature being performed prior to depositing the polarizer layer.

2. The method according to claim 1, wherein the second annealing temperature is lower that the first annealing temperature.

3. The method according to claim 1, wherein the first annealing temperature is comprised between about 340° C. and 360° C.

4. The method according to claim 1, wherein the second predetermined annealing temperature is comprised between about 150° C. and 250° C.

5. The method according to claim 1, wherein depositing the second ferromagnetic layer, the tunnel barrier layer, and the first ferromagnetic layer, is performed in this order.

6. The method according to claim 1, wherein depositing the first ferromagnetic layer, the tunnel barrier layer, and the second ferromagnetic layer is performed in this order.

7. A MRAM cell comprising a magnetic tunnel junction comprising a tunnel barrier layer between a first ferromagnetic layer having a first magnetization with a fixed orientation and a second ferromagnetic layer having a second magnetization being freely orientable, and a polarizing layer having a polarizing magnetization substantially perpendicular to the first and second magnetization; the first and second ferromagnetic layers being annealed such that a tunnel magnetoresistance of the magnetic tunnel junction is equal or greater than about 150%.

8. A magnetic memory device comprising a plurality of MRAM cells, each MRAM cell comprising a magnetic tunnel junction comprising a tunnel barrier layer between a first ferromagnetic layer having a first magnetization with a fixed orientation and a second ferromagnetic layer having a second magnetization being freely orientable, and a polarizing layer having a polarizing magnetization substantially perpendicular to the first and second magnetization; the first and second ferromagnetic layers being such that a tunnel magnetoresistance of the magnetic tunnel junction is equal or greater than about 150%.

* * * * *